(12) United States Patent
Yang et al.

(10) Patent No.: US 9,195,539 B2
(45) Date of Patent: Nov. 24, 2015

(54) METHOD FOR READING DATA FROM BLOCK OF FLASH MEMORY AND ASSOCIATED MEMORY DEVICE

(71) Applicant: Silicon Motion Inc., Hsinchu County (TW)

(72) Inventors: Tsung-Chieh Yang, Hsinchu (TW); Zhen-U Liu, Taoyuan County (TW)

(73) Assignee: Silicon Motion Inc., Hsinchu County (TW)

( * ) Notice: Subject to any disclaimer, the term of this patent is extended or adjusted under 35 U.S.C. 154(b) by 150 days.

(21) Appl. No.: 13/943,755

(22) Filed: Jul. 16, 2013

(65) Prior Publication Data

US 2014/0026018 A1 Jan. 23, 2014

Related U.S. Application Data

(60) Provisional application No. 61/672,749, filed on Jul. 17, 2012.

(30) Foreign Application Priority Data

May 3, 2013 (TW) .............................. 102115971 A

(51) Int. Cl.
*G11C 29/00* (2006.01)
*G06F 11/10* (2006.01)
*G11B 20/18* (2006.01)
*H03M 13/29* (2006.01)
*H03M 13/27* (2006.01)

(52) U.S. Cl.
CPC ........ *G06F 11/1068* (2013.01); *G06F 11/1008* (2013.01); *G06F 11/1012* (2013.01); *G06F 11/1044* (2013.01); *G06F 11/1076* (2013.01); *G11B 20/1833* (2013.01); *H03M 13/27* (2013.01); *H03M 13/29* (2013.01)

(58) Field of Classification Search
CPC . H03M 13/29; H03M 13/2957; H03M 13/27; H03M 13/2906; G11C 7/1006; G11B 20/1833
USPC .......... 714/752, 763, 755, 782, 758, 780, 773
See application file for complete search history.

(56) References Cited

U.S. PATENT DOCUMENTS

| 8,429,498 B1 * | 4/2013 | Anholt et al. ................. 714/764 |
| 2004/0117723 A1 * | 6/2004 | Foss .............................. 714/805 |
| 2008/0072120 A1 * | 3/2008 | Radke ........................... 714/768 |

(Continued)

FOREIGN PATENT DOCUMENTS

| TW | 201142870 | 12/2011 |
| TW | I354999 | 12/2011 |

*Primary Examiner* — Albert Decady
*Assistant Examiner* — Osman Alshack
(74) *Attorney, Agent, or Firm* — Winston Hsu; Scott Margo

(57) ABSTRACT

A method for reading data from a block of a flash memory is provided, where the block includes a plurality of pages and at least one parity page, each of the pages includes a plurality of sectors used for storing data and associated row parities, each of the sectors of the parity page is used to store a column parity. The method includes: reading data from a specific page of the pages; decoding the data of the specific page; and when a specific sector of the specific page fails to be decoded, sequentially reading all original data of the pages and the parity page, and performing error correction upon the specific sector according to at least a portion of the original data of the pages and the parity page corresponding to the specific sector.

21 Claims, 5 Drawing Sheets

(56) References Cited

U.S. PATENT DOCUMENTS

| | | | |
|---|---|---|---|
| 2008/0092026 A1* | 4/2008 | Brandman et al. | 714/793 |
| 2008/0109703 A1* | 5/2008 | Brandman | 714/763 |
| 2009/0222629 A1* | 9/2009 | Yano et al. | 711/137 |
| 2010/0253555 A1* | 10/2010 | Weingarten et al. | 341/51 |
| 2011/0072331 A1* | 3/2011 | Sakaue et al. | 714/763 |
| 2012/0240006 A1* | 9/2012 | Hu et al. | 714/756 |
| 2012/0240007 A1* | 9/2012 | Barndt et al. | 714/758 |
| 2014/0082458 A1* | 3/2014 | Kim et al. | 714/764 |
| 2014/0281791 A1* | 9/2014 | Marrow | 714/755 |

* cited by examiner

| | | | | | | | |
|---|---|---|---|---|---|---|---|
| P0 | Data 0_0 | RP0_0 | ... | Data 0_n | RP0_n | | |
| P1 | Data 1_0 | RP1_0 | ... | Data 1_n | RP1_n | | |
| P2 | Data 2_0 | RP2_0 | ... | Data 2_n | RP2_n | | |
| | ... | ... | ... | ... | ... | | |
| P189 | Data 189_0 | RP189_0 | ... | Data 189_n | RP189_n | | |
| P190 | CP_D01 | CP_RP01 | ... | CP_Dn1 | CP_RPn1 | | |
| P191 | CP_D02 | CP_RP02 | ... | CP_Dn2 | CP_RPn2 | | |

|  | Data 0_0 | Data 1_0 | Data 2_0 | ... | Data 189_0 | CP_D01 | CP_D02 |
|---|---|---|---|---|---|---|---|
|  | ⋮ | ⋮ | ⋮ | ... | ⋮ | ⋮ | ⋮ |
|  | b0_2 | b1_2 | b2_2 | ... | b189_2 | b190_2 | b191_2 |
|  | b0_1 | b1_1 | b2_1 | ... | b189_1 | b190_1 | b191_1 |
|  | b0_0 | b1_0 | b2_0 | ... | b189_0 | b190_0 | b191_0 |
|  | P0 | P1 | P2 |  | P189 | P190 | P191 |

FIG. 3

METHOD FOR READING DATA FROM BLOCK OF FLASH MEMORY AND ASSOCIATED MEMORY DEVICE

CROSS REFERENCE TO RELATED APPLICATIONS

This application claims the benefit of U.S. provisional application No. 61/672,749, filed on Jul. 17, 2012 and incorporated herein by reference.

BACKGROUND OF THE INVENTION

1. Field of the Invention

The disclosed embodiments of the present invention relate to a flash memory, and more particularly, to a method for reading data from a block of a flash memory and related memory apparatus.

2. Description of the Prior Art

A flash memory can be used to store data through electrical erase and write/program, and is widely applied in the field of memory cards, solid-state drives, portable multi-media players, etc. Because the flash memory is a non-volatile memory, there is no need for extra power to maintain what is stored in the flash memory. In addition, the flash memory provides high speed data access and excellent vibration resistance, which explains its popularity.

The flash memories can be classified into two categories: NOR flash memories and NAND flash memories. For the later, the erase time and program time is shorter, and the die size of each memory unit is smaller. Thus, compared with the NOR flash memory, the NAND flash memory permits higher storage density and lower cost per bit. Generally speaking, the flash memory consists of memory unit arrays, wherein each memory unit is implemented using a floating-gate transistor in practice, and the threshold voltage of the memory unit is configured by properly controlling charge number at a floating gate of the floating-gate transistor to thereby store a single-bit data or a multi-bit data. Therefore, when one or more predetermined control gate voltages are imposed at the control gate of the floating-gate transistor, a conduction status of the floating-gate transistor will indicate one or more binary digits stored in the floating-gate transistor.

However, due to certain reasons, the original charge number of the flash memory may be affected/disturbed. For instance, the disturbance may come from write/program disturbance, read disturbance and/or retention disturbance. In a case where a NAND flash memory has memory units storing at least one bit respectively, a physical page includes multiple logical pages, and each logical page is read by applying one or more control gate voltages. For instance, a flash memory unit used for storing a 3-bit data should has one of 8 states (i.e., 8 electrical charge levels) corresponding to different charge numbers. However, due to program/erase count (P/E count) and/or retention time, the threshold voltage distribution of memory units in the flash memory unit may change. Therefore, using the original configurations of the control gate voltages to read stored information of the flash memory unit may fail to correctly obtain the stored information.

Changes or offsets of the threshold voltage distribution of the memory units of the flash memory unit often cause read errors. Fortunately, this could be overcome/mitigated by error correction codes (ECCs). However, after repeated read and write of the flash memory unit, the noise occurrence in the flash memory unit no longer has a Gaussian noise distribution. Instead, the occurrence probability of stronger noise (i.e. the threshold voltage distribution of the memory unit has a larger change or offset) is higher than that of noise that is relatively weak (i.e. the threshold voltage distribution of the memory unit has a smaller change or offset). Therefore, an error correction code with more bits is required to deal with this case, which consumes the flash memory capacity inevitably.

SUMMARY OF THE INVENTION

Therefore, one of the objectives of the present invention is to provide a method for reading data from a block of a flash memory and related memory apparatus, wherein data of the flash memory is generated via a specific coding, so as to solve the issues set forth.

According to an embodiment of the present invention, a method for reading data from a block of a flash memory is disclosed. Where, the block comprises a plurality of pages and at least one parity page; each of the pages comprises a plurality of sectors used for storing data and associated row parities, each of the sectors of the parity page is used to store a column parity which is generated in accordance with a sector of each of the pages; the method comprises: reading data from a specific page of the pages; decoding the data of the specific page; and when a specific sector of the specific page fails to be decoded, sequentially reading all original data of the pages and the parity page, and performing error correction upon the specific sector according to at least a portion of the original data of the pages and the parity page corresponding to the specific sector.

According to another embodiment of the present invention, a memory apparatus is disclosed. The memory apparatus comprises a flash memory and a controller. The flash memory comprises a plurality of blocks; each of the blocks comprises a plurality of pages and at least one parity page; each of the pages comprises a plurality of sectors used for storing data and associated row parities; each of the sectors of the parity page is used to store a column parity which is generated in accordance with a sector of each of the pages. The controller is arranged for reading data from a specific page of the pages, and decoding the data of the specific page, and when a specific sector of the specific page fails to be decoded, sequentially reading all original data of the pages and the parity page, and performing error correction upon the specific sector according to at least a portion of the original data of the pages and the parity page corresponding to the specific sector.

According to yet another embodiment of the present invention, a controller for accessing a flash memory is disclosed. The flash memory includes a plurality of blocks; each of the blocks comprises a plurality of pages and at least one parity page; each of the pages comprises a plurality of sectors used for storing data and associated row parities; each of the sectors of the parity page is used to store a column parity which is generated in accordance with a sector of each of the pages; the controller comprises a read only memory (ROM), a micro processor and an error correction code unit. The read only memory (ROM) is arranged for storing a program code. The micro processor is arranged for executing the program code to control access of the flash memory and manage the blocks. When a specific sector of the specific page fails to be decoded by the error correction code unit, the error correction code unit sequentially reads all original data of the pages and the parity page, and performs error correction upon the specific sector according to at least a portion of the original data of the pages and the parity page corresponding to the specific sector.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a diagram illustrating a block of the flash memory.

FIG. 3 is a diagram illustrating a method for generating the column parities as shown in FIG. 2.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
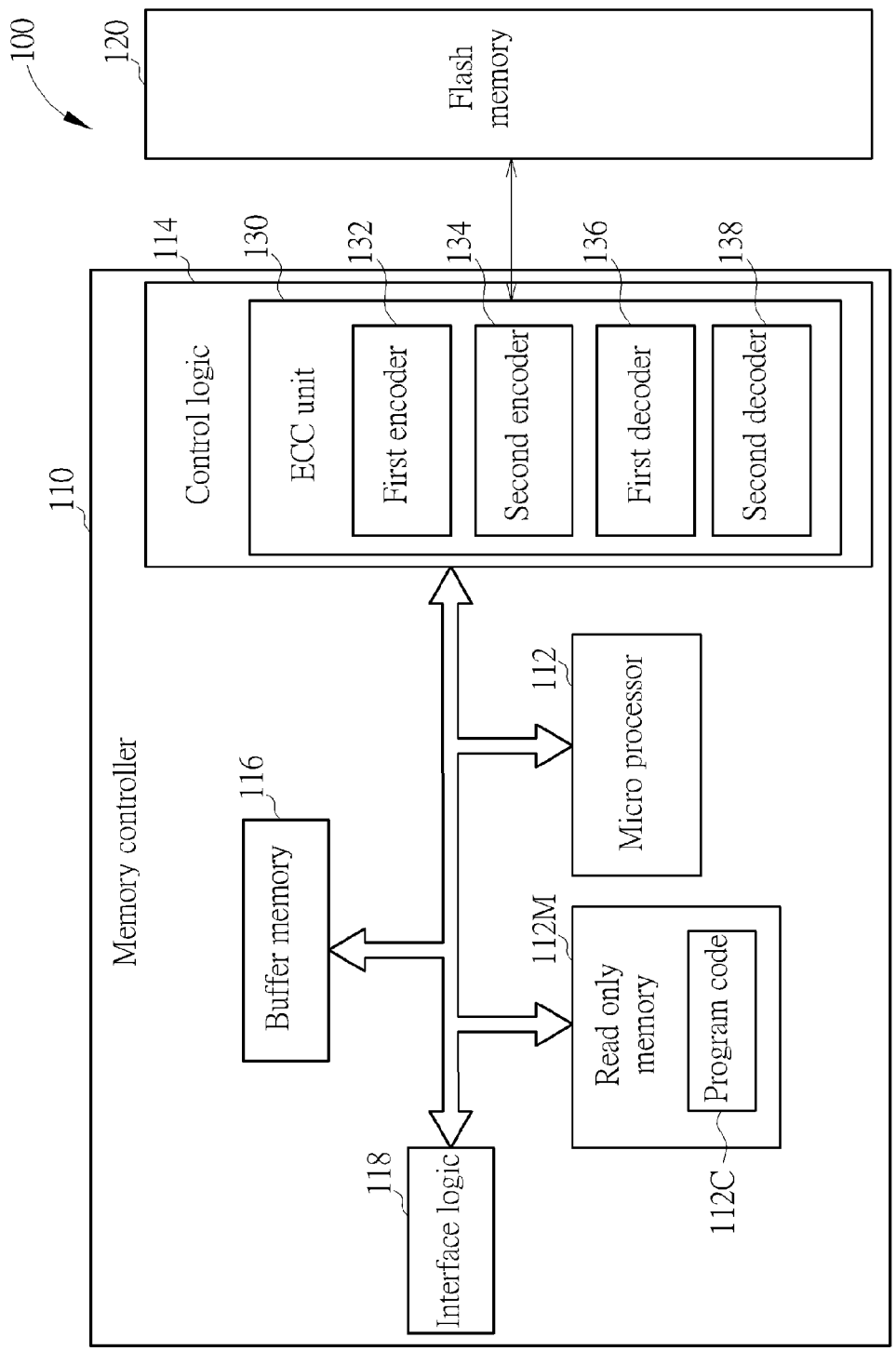
FIG. 1 is a diagram illustrating a memory apparatus according to an embodiment of the present invention.

Please refer to FIG. 1, which is a diagram illustrating a memory apparatus 100 according to an embodiment of the present invention. The memory apparatus 100 of the present invention is particularly a portable memory apparatus (e.g. a memory card complying with SD/MMC, CF, MS or XD standard). The memory apparatus 100 includes a flash memory 120 and a controller. The controller may be a memory controller 110 arranged for accessing the flash memory 120. According to this embodiment, the memory controller 110 includes a microprocessor 112, a read only memory (ROM) 112M, a control logic 114, a buffer memory 116 and an interface logic 118. The read only memory 112M is used for storing a program code 112C, and the micro processor 112 is used for executing the program code 112C to control access of the flash memory 120. In addition, the control logic 114 includes an error correction code (ECC) unit 130. The ECC unit 130 includes a first encoder 132, a second encoder 134, a first decoder 136 and a second decoder 138, where part of circuits of the first encoder 132, the second encoder 134, the first decoder 136 and the second decoder 138 may be shared between the first encoder 132, the second encoder 134, the first decoder 136 and the second decoder 138, or the first encoder 132, the second encoder 134, the first decoder 136 and the second decoder 138 may be implemented using standalone circuits independent of each other.

In a typical case, the flash memory 120 includes a plurality of blocks, and the controller (e.g. the memory controller 110 which executes the program code 112C through the micro processor 112) performs processes, including copying data, erasing data, merging data, etc., upon the flash memory 120, where the erase process is a block based process. In addition, a block records a specific number of pages, wherein the write process performed by the controller (e.g. the memory controller 110 which executes the program code 112C through the micro processor 112) upon the flash memory 120 is a page based process.

In practice, the memory controller 110 may utilize its internal components to perform a variety of processes. For instance, the memory controller 110 utilizes the control logic 114 to control the access of the flash memory 120 (particularly, the access of at least one block or at least one page), or utilizes the buffer memory 116 to perform the desired buffering process, or utilizes the interface logic 118 to communicate with a host device.

Please refer to FIG. 2, which is a diagram illustrating a block 200 of the flash memory 120. As shown in FIG. 2, the block 200 includes 192 pages P0-P191. The pages P0-P189 are used for storing data and its row parities, and the pages P190, P191 are used as parity pages dedicated to recording column parities of the pages P0-P189. More specifically, when the memory controller 110 requests for writing data into the block 200 of the flash memory 120, the first encoder 132 of the memory controller 110 may utilize a first encoding method to write the data into pages P0-P189 of the block 200 page by page. The first encoding method may be a soft decoding method such as a low density parity check (LDPC) encoding method or any other appropriate encoding method. That is to say, the memory controller 110 utilizes the first encoding method to encode the data to be written, and then generates data and its row parities (Data0_0 and RP0_0, Data0_n and RP0_n, . . . , Data189_n and RP189_n) and writes the data and the corresponding row parities to the pages P0-P189, wherein one set of data and its row parity (e.g. Data0_0 and RP0_0) constitutes a codeword (i.e., a sector of the page).

After data recording of all the pages P0-P189 is complete, the second encoder 134 of the memory controller 110 utilizes a second encoding method to generate column parities of the pages P0-P189, and writes the column parities into the parity pages P190 and P191, wherein the second encoding method may be a hard decoding method such as a Bose-Chaudhuri-Hocquenghem (BCH) encoding method or any other appropriate encoding method. More specifically, please refer to FIG. 3, which is a diagram illustrating the generation of the column parities CP_D01 and CP_D02 shown in FIG. 2. As shown in FIG. 3, the second encoder 134 performs bit level column encoding which uses bits as a column encoding unit. The second encoder 134 first encodes the first bits (i.e. b0_0-b189_0) of the pages P0-P189 to generate bits b190_0 and b191_0 of the column parities CP_D01 and CP_D02, respectively. Next, the second encoder 134 encodes the second bits (i.e. b0_1-b189_1) of the pages P0-P189 to generate bits b190_1 and b191_1 of the column parities CP_D01 and CP_D02 respectively, and so on. Lastly, after all of the bits of the column parities CP_D01 and CP_D02 are obtained, the column parities CP_D01 and CP_D02 will be written into the parity pages P190 and P191.

It should be noted that, although the encoding method shown in FIG. 3 is a bit level encoding method, the present invention is not limited to it. In other embodiments of the present invention, the encoding method may also be a byte level encoding method which uses bytes as an encoding unit or an encoding method which uses a different number of bits as the encoding unit. For instance, when a byte level encoding method is employed, the memory controller 110 first encodes first bytes of the pages P0-P189 to generate two bytes of the row parities CP_D01 and CP_D02, respectively; next, the memory controller 110 encodes second bytes of the pages P0-P189 to generate two bytes of the row parities CP_D01 and CP_D02, respectively, and so on. These alternative designs all fall within the scope of the present invention.

In addition, it should be noted that FIG. 2 and FIG. 3 are for illustrative purpose only, not a limitation of the present invention. In other embodiments of the present invention, the number of pages and the number of parity pages of the block 200 can be modified, and positions of the parity pages can also be modified. For instance, pages P95 and P191 of the block 200 can be used as parity pages, where the parity page P95 is used to store the column parities of the pages P0-P94, and the parity page P191 is used to store the column parities of the pages P96-P190. These alternative designs all fall within the scope of the present invention.

Figure 4A:
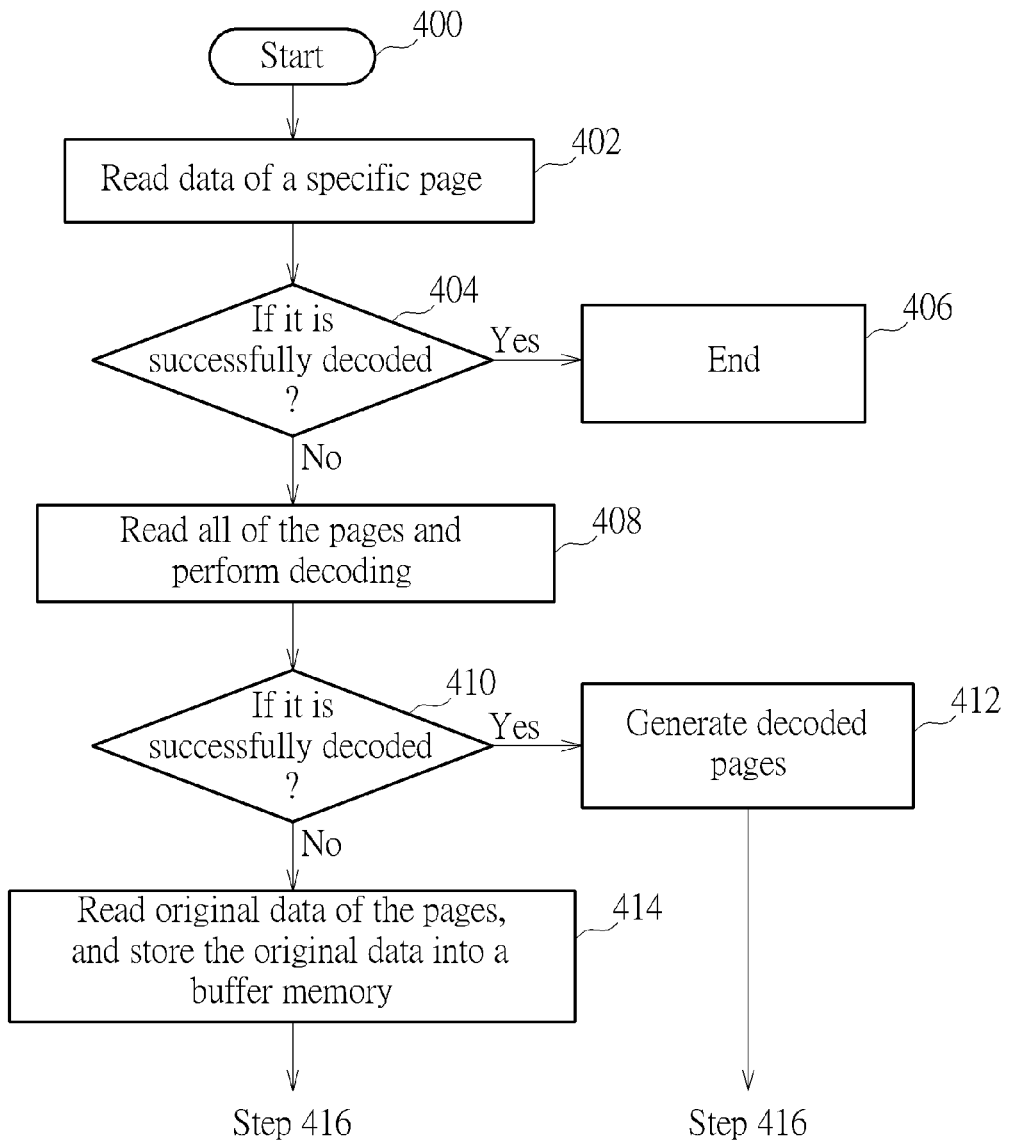
FIG. 4A is a flowchart illustrating a method for reading data of a block in a flash memory according to an embodiment of the present invention.
Figure 4B:
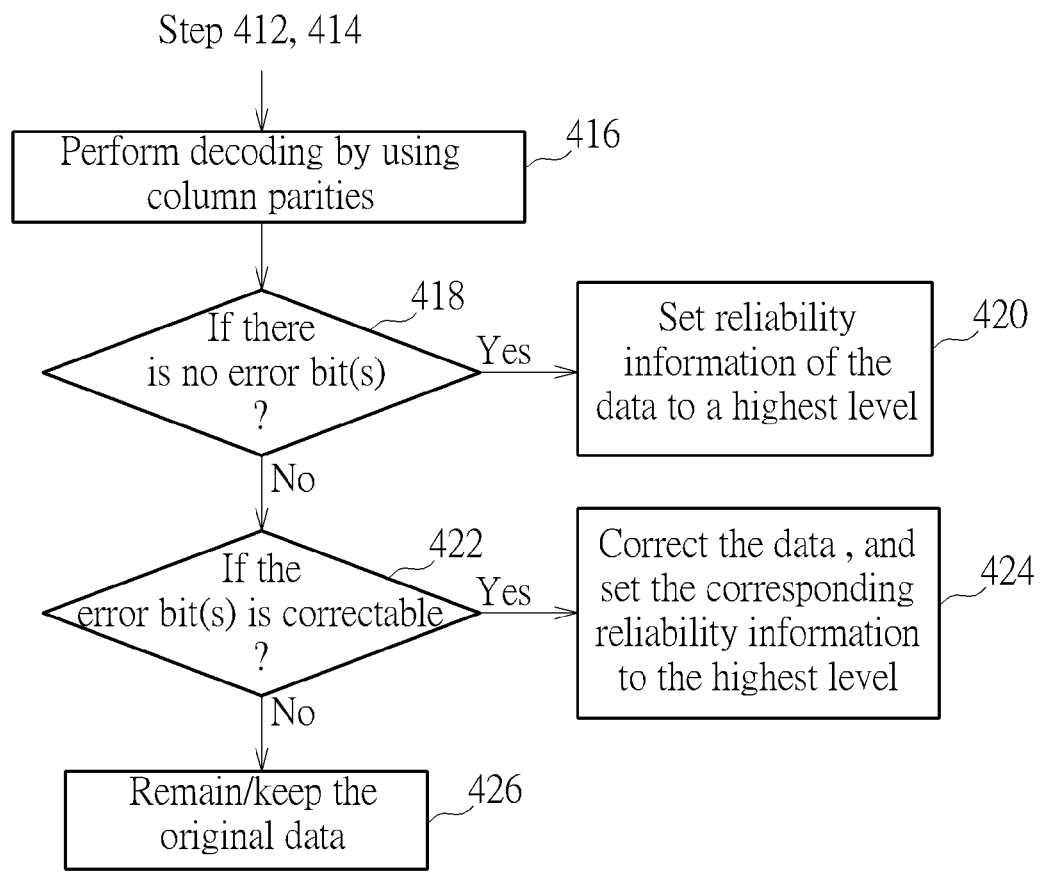
FIG. 4B is a continued flowchart of the method for reading data of the block in the flash memory.

Next, please refer to FIGS. 4A and 4B, which are flowcharts illustrating a method for reading data of a block in a flash memory according to an embodiment of the present invention. The following descriptions are based on the block 200 shown in FIG. 2, and the page P2 acts as the page to be read by the memory controller 110. Referring to FIGS. 1-4, details of the flow are described as follow.

In step 400, the flow starts. In step 402, the memory controller 110 reads data of a specific page in the block 200, that is to say, the memory controller 110 reads data of the page P2. In this embodiment, the data of the page P2 in the memory controller 110 is soft information. For instance, for the first bit b2_0 of the page P2, the memory controller 110 reads the corresponding memory unit several times (e.g. 7 times) to generate a bit sequence. The bit sequence is used to be the soft information of the first bit b2_0 of the page P2, wherein the reliability information of the bit value is included (i.e. the bit sequence is indicative of probability of the bit value being logic "1" and the probability of the bit value being logic "0"). For instance, in a case where the soft information of the first bit b2_0 is "1111111", the probability of the first bit b2_0 being logic "1" is highest; in a case where the soft information of the first bit b2_0 is "0000000", the probability of the first bit b2_0 being logic "0" is highest. Please note that the reliability information is not limited to the above description. As those persons skilled in the art should be familiar with the usage of soft information, detailed descriptions are omitted here for brevity.

Next, in step 404, the first decoder 136 decodes the data of the page P2. In this embodiment, the first decoder 136 performs the LDPC decoding upon the data of the page P2. That is to say, data and its parity (e.g. Data2_0 and RP2_0) of each sector are used to generate correct data through LDPC decoding (i.e. error(s) in Data2_0 can be corrected pursuant to the row parity RP2_0). If the first decoder 136 successfully decodes the data, this means that errors in all sectors of page P2 can be successfully corrected by referring to the row parity. Therefore, the first decoder 136 generates decoded data to the buffer memory 116 for further processing. The flow proceeds with step 406 such that the flow is ended. If the first decoder 136 fails to decode the data, this implies that at least one of the sectors of page P2 contains too many errors to be corrected. Therefore, the flow enters step 408.

In step 408, the memory controller 110 reads all of the pages P0-P91 in the block 200, sequentially; and the first decoder 136 performs LDPC decoding upon the data in the pages P0-P189, sequentially.

In step 410, it is checked to see if the decoding process of each sector in each page in the pages P0-P189 is successful. If yes, the flow will enter step 412 such that the decoded data will be stored in the buffer memory 116; otherwise, the flow will enter step 414 such that the memory controller 110 will read the original data of the sectors dialed to be decoded, and store the original data (soft information) and position of the sector into an error record table in the buffer memory 116. For instance, in a case where the first sectors of the pages P0 and P2 fail to be decoded successfully, the memory controller reads the original data of the first sectors of the pages P0 and P2 (i.e. Data0_0, RP0_0, Data2_0 and RP2_0 shown in FIG. 2), stores the original data in the buffer memory 116, and then records this case in the error record table of the buffer memory 116.

Next, in step 416, the second decoder 138 decodes the decoded data (which is generated in step 412) of each sector in each page of the pages P0-O189 stored in the buffer memory 116, or decodes the original data (which is generated in step 414) and the column parities in the parity pages P190 and P191 (in this embodiment, BCH decoding is employed). More specifically, after the error record table is checked, if only the first sectors of the pages P0 and P2 of the block 200 are not able to be successfully decoded by using the first decoder 136, then the second decoder 138 will first decode first bits of the pages P0-P189 and the parity pages P190-P191 (i.e. b0_0, b1_0, b2_0, . . . , b191_0), and generate a decoding result, where the decoding result is used to indicate whether the first bits of the pages P0-P189 have error(s). Then, in step 418, it is checked to determine whether the decoding result indicates occurrence of error bit(s). If the decoding result indicates that there is no error bits, then the flow proceeds with step 420 to set the reliability information of the original data (stored in the buffer memory 116) of the first bits b0_0 and b2_0 of the pages P0 and P2 to the highest level (i.e. the probability of b0_0 and b2_0 being logic "1" or logic "0" is very high; for instance, the original data of b0_0 and b2_0 are both set by "1111111" or "0000000"). If the decoding result indicates there are error bits, then the flow proceeds with step 422 to determine whether the original data of the first bits b0_0 or b2_0 of the pages P0 or P2 is correctable. If the data is correctable, step 424 will be entered to correct the original data of the first bits b0_0 and b2_0 of the pages P0 or P2, and the corresponding reliability information will be set to the highest level. If the data is uncorrectable, step 426 will be entered to remain/keep the original data of the first bits b0_0 and b2_0 of the pages P0 or P2.

Similarly, regarding the second bits of the pages P0-P189 and the parity pages P190-P191 (i.e. b0_1, b1_1, b2_1, . . . , b191_1), the second decoder 138 decodes these second bits to generate a decoding result. Then, through steps 418-426, it is determined whether to correct or remain/keep the original data of the second bits b0_1 and b2_1 of the pages P0 and P2. The second decoder 138 continues to decode the data in the pages P0-P189 and parity pages P190-P191. After the last bit is decoded, the first sector data of the pages P0 and P2 stored in the buffer memory 116 has been well corrected. Therefore, the first decoder 136 can perform the LDPC decoding upon the first sector data of the pages P0 and P2 stored in the buffer memory again to obtain the decoded data. Please note that, similar to the encoding operation which may use bits, bytes or a different number of bits as an encoding unit, the decoding operation may also bits, bytes or a different number of bits as a decoding unit. Although the embodiment set forth employs the bit level decoding, those persons skilled in the art should readily appreciate that the decoding operation may be performed based on bytes or any other bit number. These alternative designs also fall within the scope of the present invention.

In addition, the flow shown in FIG. 4 is for illustrative purpose only, and not a limitation of the present invention. In an embodiment of the present invention, the memory controller 110 may perform the LDPC decoding process upon all of the data of the pages P0-P189, and store all of the sectors with decoding failure into the buffer memory 116. Besides, the memory controller 110 refers to all of the column parities in the parity pages P190-P191 for performing the BCH decoding upon all the data in the block 200, so as to correct error(s) in the original data of all of the sectors in the buffer memory 116 that have with decoding failure. In addition, in another embodiment of the present invention, the memory controller 110 may only perform the LDPC decoding process upon sectors corresponding to specific sectors required to be decoded. That is to say, supposing the user merely needs the data of the first sector of the page P2 and the sector can not be decoded through the LDPC decoding process, the memory controller 110 can perform the LDPC decoding process upon the data of the first sector in the pages P0-P189 only, where the sectors with decoding failure is stored in the buffer memory 116, and then the column parity of the first sector of the pages P190-P191 is used to decode the data of the first sector of the pages P0-P189. These alternative designs set forth all fall within the scope of the present invention.

Besides, in yet another embodiment of the present invention, the first decoder 136 and the second decoder 138 can perform the decoding process, iteratively. For instance, the first decoder 136 performs the LDPC decoding upon the first sector of the pages P0-P189, and the second decoder 138 refers to the parity pages P190-P191 for performing the BCH decoding upon the pages P0-P189 to correct part of the errors; and the first decoder 136 performs the LDPC decoding upon the first sector of the pages P0-P189 again to generate more decoded data, and the second decoder 138 refers to the parity pages P190-P191 again for performing the BCH decoding upon the pages P0-P189 to correct the rest of the errors. Such an iterative decoding operation is performed repeatedly. In this way, the sectors with more error bits are more likely to be corrected.

In summary, a portion of the pages of the flash memory block of the present invention is used for storing the parity pages of the column pages. When a specific page fails to be successfully decoded/corrected pursuant to the row parities, the memory controller will sequentially read the other pages and the parity pages, and use the column parities to correct a partial content of the specific page, thus increasing the probability of successfully decoding the specific page in the following decoding operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading data from a block of a flash memory, wherein the block comprises a plurality of pages and at least one parity page, each of the pages comprises a plurality of sectors used for storing data and associated row parities, and each of the sectors of the parity page is used to store a column parity which is generated in accordance with a sector of each of the pages; the method comprising:
   reading data from a specific page of the pages;
   decoding the data of the specific page; and
   when a specific sector of the specific page fails to be decoded successfully, sequentially reading all original data of the pages and the parity page, and performing error correction upon the specific sector according to at least a portion of the original data of the pages and the parity page corresponding to the specific sector, comprising:
      decoding the sectors of the pages that correspond to the specific sector, and generating a corresponding decoded data when decoding of the sectors is successful;
      recording the specific sector with decoding failure and its original data into a storage unit;
      decoding the corresponding decoded data of the sectors or the original data, along with a column parity of the at least one parity page corresponding to the specific sector, to generate a decoding result; and
      using the decoding result to perform error correction upon the specific sector.

2. The method of claim 1, further comprising:
   after performing error correction upon the specific sector, decoding corrected data of the specific sector.

3. The method of claim 1, wherein the original data of the specific sector stored in the storage unit is soft information, the soft information comprises bit value reliability information, and the step of using the decoding result to perform error correction upon the specific sector comprises:
   when the decoding result indicates that a specific bit of the specific sector is not erroneous, setting the bit value reliability information corresponding to the specific bit to a highest level.

4. The method of claim 1, wherein the original data of the specific sector stored in the storage unit is soft information, the soft information comprises bit value reliability information, and the step of using the decoding result to perform error correction upon the specific sector comprises:
   when the decoding result indicates that a specific bit of the specific sector is erroneous and is correctable, correcting the specific bit and setting the bit value reliability information corresponding to the specific bit to a highest level.

5. The method of claim 1, wherein the step of decoding the sectors of the pages that correspond to the specific sector comprises:
   using a first decoding method to decode the sectors in the pages corresponding to the specific sector; and
   the step of decoding the corresponding decoded data of the sectors or the original data, along with the column parity of the at least one parity page corresponding to the specific sector, comprises:
   using a second decoding method different from the first decoding method to decode the decoded data of the sectors or the original data, along with the column parity of the at least one parity page corresponding to the specific sector.

6. The method of claim 5, wherein the first decoding method is a soft decoding method, and the second decoding method is a hard decoding method.

7. The method of claim 5, wherein the first decoding method is a Low Density Parity Check (LDPC) decoding method, and the second decoding method is a Bose-Chaudhuri-Hocquenghem (BCH) decoding method.

8. A memory apparatus, comprising:
   a flash memory, wherein the flash memory comprises a plurality of blocks, each of the blocks comprises a plurality of pages and at least one parity page, each of the pages comprises a plurality of sectors used for storing data and associated row parities, and each of the sectors of the parity page is used to store a column parity which is generated in accordance with a sector of each of the pages; and
   a controller, arranged for:
      reading data from a specific page of the pages;
      decoding the data of the specific page; and
      when a specific sector of the specific page fails to be decoded successfully, sequentially reading all original data of the pages and the parity page, and performing error correction upon the specific sector according to at least a portion of the original data of the pages and the parity page corresponding to the specific sector;

wherein the controller decodes the sectors of the pages that correspond to the specific sector, and generates a corresponding decoded data when decoding of the sectors is successful; and the controller records the specific sector with decoding failure and its original data into a storage unit; and the controller decodes the corresponding decoded data of the sectors or the original data, along with a column parity of the at least one parity page corresponding to the specific sector, to generate a decoding result; and the controller uses the decoding result to perform error correction upon the specific sector.

9. The memory apparatus of claim 8, wherein after error correction upon is performed the specific sector, the controller decodes corrected data of the specific sector.

10. The memory apparatus of claim 8, wherein the original data of the specific sector stored in the storage unit is soft information, the soft information comprises bit value reliability information, and when the decoding result indicates that a specific bit of the specific sector is not erroneous, the controller sets the bit value reliability information corresponding to the specific bit to a highest level.

11. The memory apparatus of claim 8, wherein the original data of the specific sector stored in the storage unit is soft information, the soft information comprises bit value reliability information, and when the decoding result indicates a specific bit of the specific sector is erroneous and is correctable, the controller corrects the specific bit and sets the bit value reliability information corresponding to the specific bit to a highest level.

12. The memory apparatus of claim 8, wherein the controller uses a first decoding method to decode the sectors in the pages corresponding to the specific sector; and the controller uses a second decoding method different from the first decoding method to decode the corresponding decoded data of the sectors or the original data, along with the column parity of the at least one parity page corresponding to the specific sector.

13. The memory apparatus of claim 12, wherein the first decoding method is a soft decoding method, and the second decoding method is a hard decoding method.

14. The memory apparatus of claim 12, wherein the first decoding method is a Low Density Parity Check (LDPC) decoding method, and the second decoding method is a Bose-Chaudhuri-Hocquenghem (BCH) decoding method.

15. A controller for accessing a flash memory, wherein the flash memory includes a plurality of blocks, each of the blocks comprises a plurality of pages and at least one parity page, each of the pages comprises a plurality of sectors used for storing data and associated row parities, and each of the sectors of the parity page is used to store a column parity which is generated in accordance with a sector of each of the pages; the controller comprising:

a read only memory (ROM), arranged for storing a program code;

a micro processor, arranged for executing the program code to control access of the flash memory and manage the blocks; and an error correction code (ECC) unit;

where when a specific sector of the specific page fails to be successfully decoded by the ECC unit, the ECC unit sequentially reads all original data of the pages and the parity page, and performs error correction upon the specific sector according to at least a portion of the original data of the pages and the parity page corresponding to the specific sector;

wherein the ECC unit decodes the sectors of the pages that correspond to the specific sector, and generates a corresponding decoded data when decoding of the sectors is successful; and the ECC unit records the specific sector with decoding failure and its original data into a storage unit; and the ECC unit decodes the corresponding decoded data of the sectors or the original data, along with a column parity of the at least one parity page corresponding to the specific sector, to generate a decoding result; and the ECC unit uses the decoding result to perform error correction upon the specific sector.

16. The controller of claim 15, wherein after error correction is performed upon the specific sector, the ECC unit decodes corrected data of the specific sector.

17. The controller of claim 15, wherein the original data of the specific sector stored in the storage unit is soft information, the soft information comprises bit value reliability information, and when the decoding result indicates that a specific bit of the specific sector is not erroneous, the ECC unit sets the bit value reliability information corresponding to the specific bit to a highest level.

18. The controller of claim 15, wherein the original data of the specific sector stored in the storage unit is soft information, the soft information comprises bit value reliability information, and when the decoding result indicates that a specific bit of the specific sector is erroneous and is correctable, the ECC unit corrects the specific bit and sets the bit value reliability information corresponding to the specific bit to a highest level.

19. The controller of claim 15, wherein the error correction code unit comprises a first decoder and a second decoder, the first decoder uses a first decoding method to decode the sectors in the pages corresponding to the specific sector; and the second decoder uses a second decoding method different from the first decoding method to decode the decoded data of the sectors or the original data, along with the column parity of the at least one parity page corresponding to the specific sector.

20. The controller of claim 19, wherein the first decoding method is a soft decoding method, and the second decoding method is a hard decoding method.

21. The controller of claim 19, wherein the first decoding method is a Low Density Parity Check (LDPC) decoding method, and the second decoding method is a Bose-Chaudhuri-Hocquenghem (BCH) decoding method.

* * * * *